(12) United States Patent
Miura

(10) Patent No.: US 6,501,506 B1
(45) Date of Patent: Dec. 31, 2002

(54) SOLID IMAGE PICK-UP UNIT AND DRIVING METHOD THEREFOR

(75) Inventor: Hiroki Miura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/042,575

(22) Filed: Mar. 17, 1998

(30) Foreign Application Priority Data

Mar. 18, 1997 (JP) ............................................. 9-064647
Feb. 24, 1998 (JP) ........................................... 10-042066

(51) Int. Cl.$^7$ ................................................ H04N 3/14
(52) U.S. Cl. ........................ 348/308; 348/301; 348/310; 250/208.1; 257/291
(58) Field of Search ............................... 348/207, 294, 348/297, 300–303, 307–312, 315–324; 250/208.1; 257/229, 230, 231, 290, 291, 292, 293; H04N 3/14

(56) References Cited

U.S. PATENT DOCUMENTS

| | | | | | |
|---|---|---|---|---|---|
| 5,631,704 | A | * | 5/1997 | Dickinson | .................... 348/308 |
| 5,698,844 | A | * | 12/1997 | Shinohara | ................. 250/208.1 |
| 6,037,577 | A | * | 3/2000 | Tanaka | ......................... 348/302 |
| 6,166,769 | A | * | 12/2000 | Yonemoto | .................... 348/308 |
| 6,320,616 | B1 | * | 11/2001 | Sauer | .......................... 348/310 |

* cited by examiner

*Primary Examiner*—Ngoc-Yen Vu
(74) *Attorney, Agent, or Firm*—Oblon, Spivak, McClelland, Maier & Neustadt, P.C.

(57) ABSTRACT

The present invention relates to a solid image pick-up unit which can restrict a variation in the leakage charge quantity at the light emitting time and non-emitting time of the LED and in which a signal charge quantity can be increased and adjusted without increasing the number of LED. A photodiode is connected to two sample-hold transistors for transferring charges to two sample-hold capacitors respectively through a transfer transistor, and is also connected to a reset transistor and an amplification transistor through the transfer transistor. Further, the amplification transistor is connected with an address transistor. The two sample-hold capacitors are disposed at positions symmetrical with the center of the n-diffusion layer of the photodiode.

4 Claims, 13 Drawing Sheets

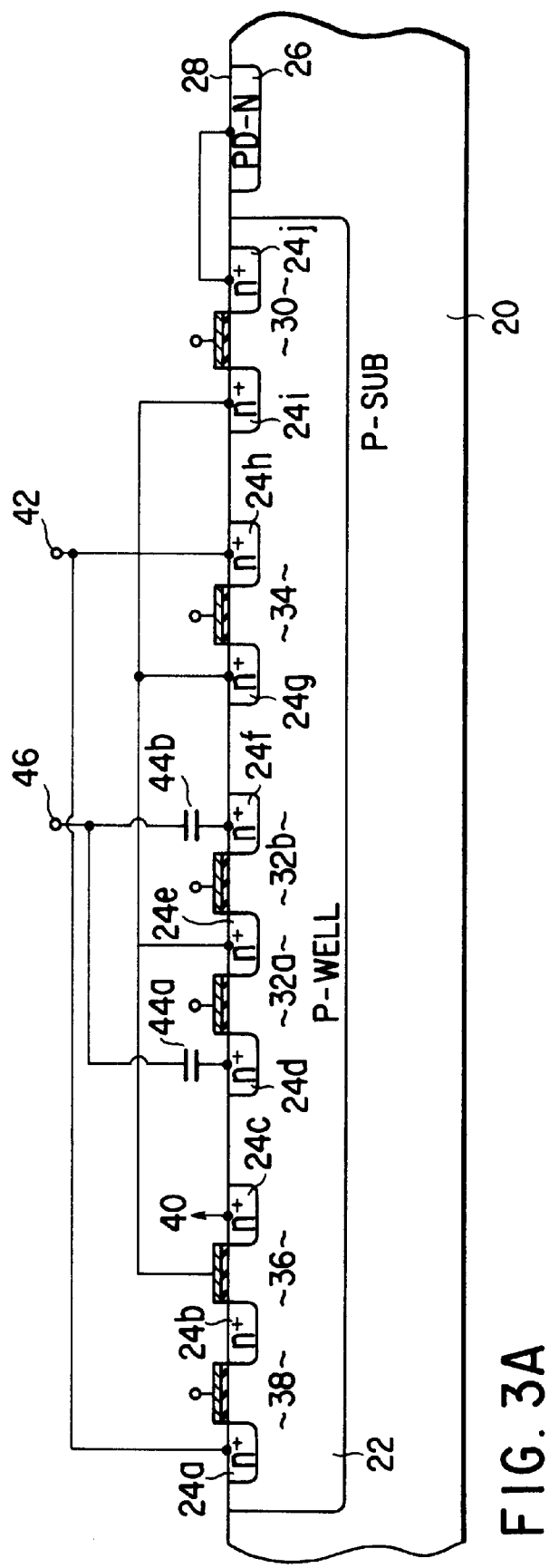
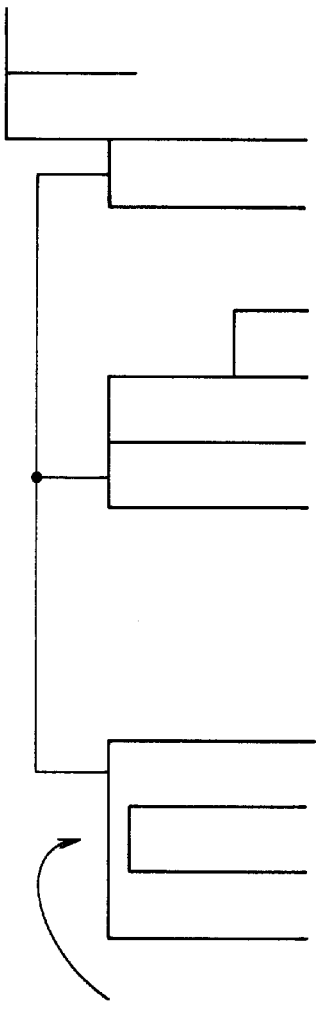
FIG. 3A
FIG. 3B

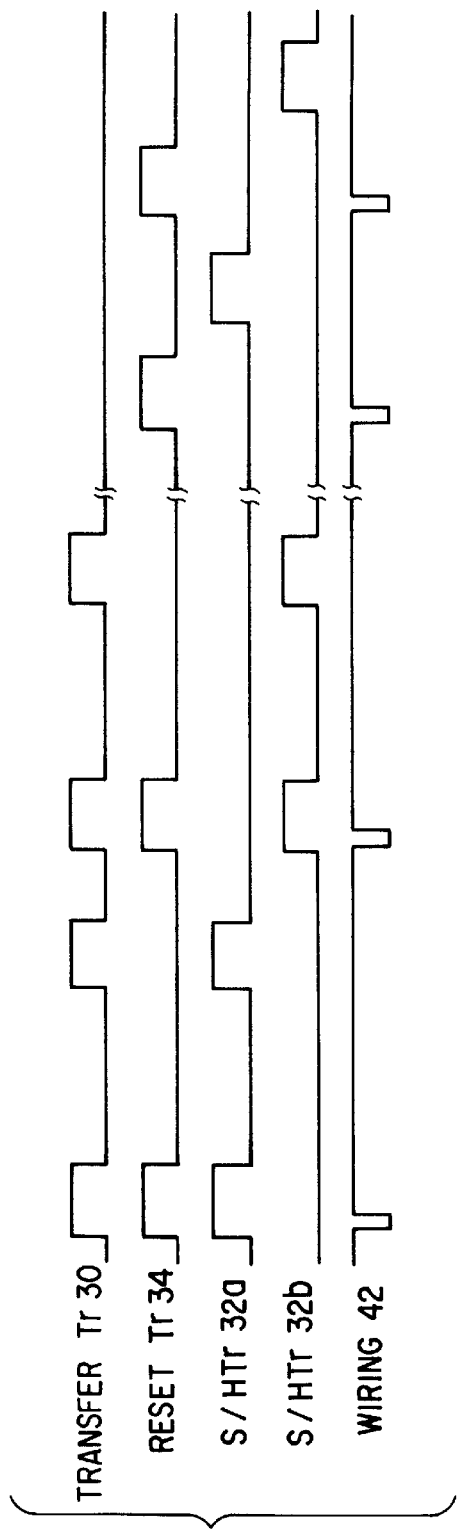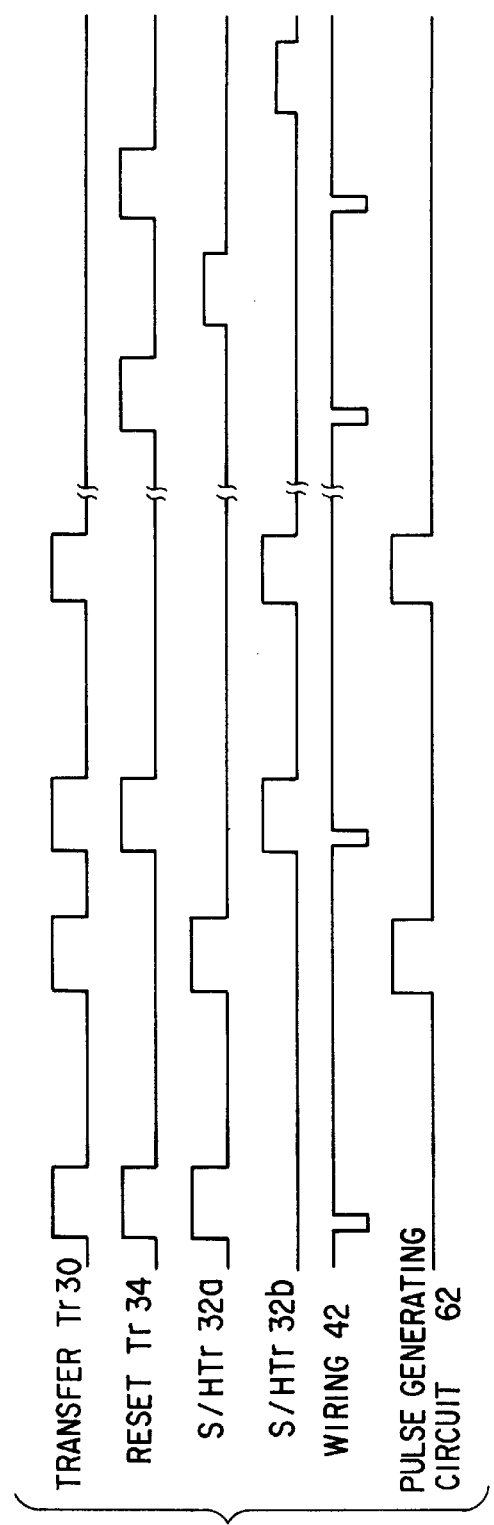

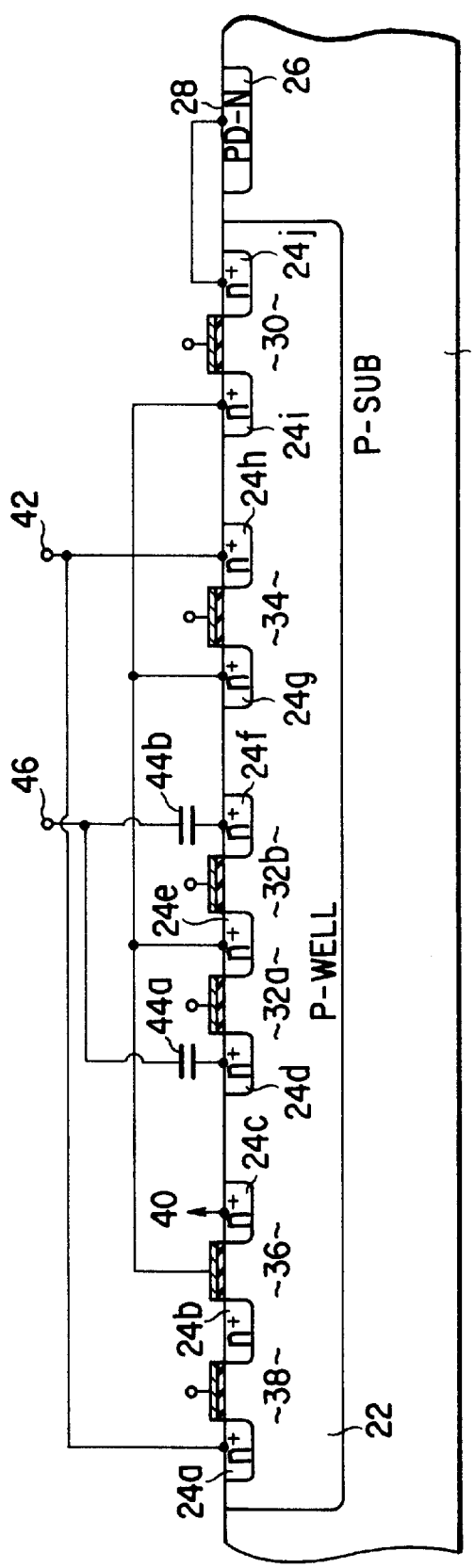
FIG. 7A
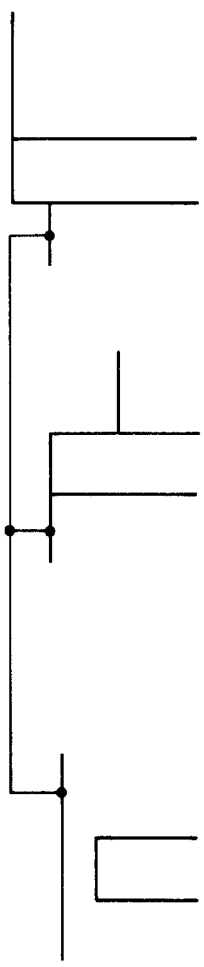
FIG. 7B
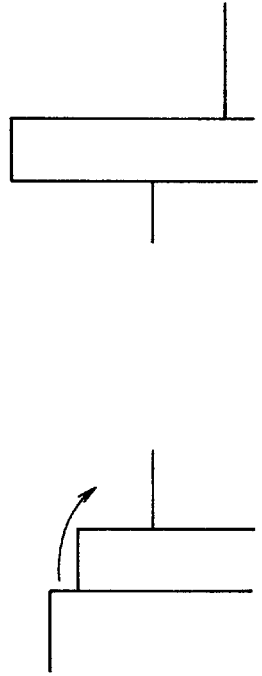
FIG. 7C
FIG. 7D

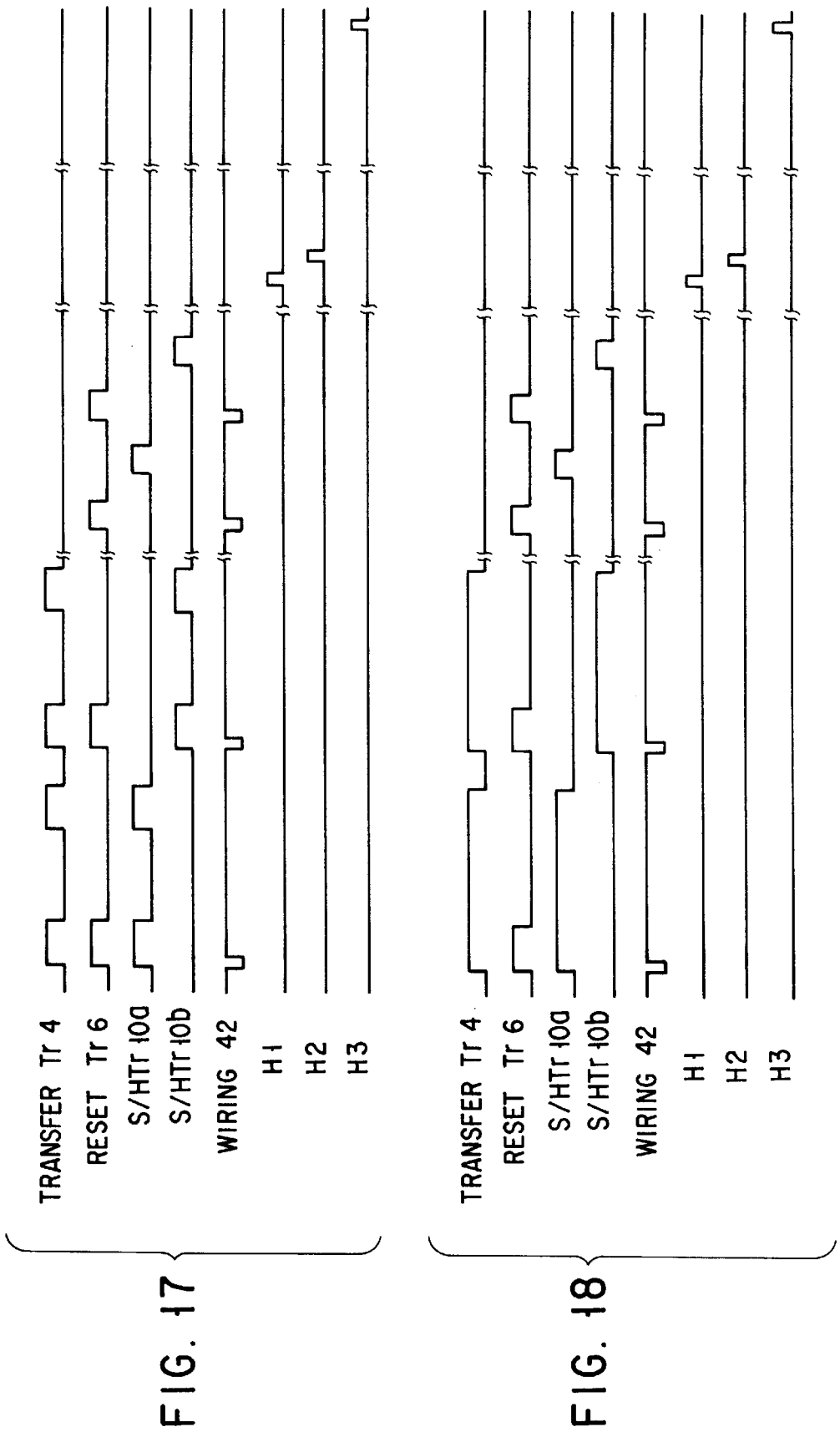

SOLID IMAGE PICK-UP UNIT AND DRIVING METHOD THEREFOR

BACKGROUND OF THE INVENTION

The present invention relates to an amplification-type solid image pick-up unit and a method of driving the same, and relates more particularly to an amplification-type solid image pick-up unit which can improve an S/N ratio and which can adjust sensitivity easily and a method of driving this solid image pick-up unit.

As an example of the MOS-type image sensor that has been used conventionally, there has been known a one having a structure as described in the Japanese Patent Application No. 8-275949 which is a prior application made by the inventor of the present invention.

FIG. 1 a diagram for showing a circuit structure of the main portion of the image sensor described in the Japanese Patent Application No. 8-275949.

In FIG. 1, this image sensor has a photodiode 2 connected to a reset transistor 6 and an amplification transistor 8 through a transfer transistor 4. A circuit structured by a transfer transistor 10a and sample hold capacitor 12a and a circuit structured by a transfer transistor 10b and sample hold capacitor 12b are connected in parallel respectively between the transfer transistor 4 and the amplification transistor 8.

The amplification transistor 8 has its drain connected to the source of an address transistor 14 and has its source connected to a vertical signal line 16. The gate of the address transistor 14 is connected to a horizontal address line 18. Further, the amplification transistor 8 is connected to a horizontal selection transistor through the vertical signal line 16 and a differential circuit not shown.

In the above-described structure, it becomes possible to cancel a variation in the threshold value of the amplification transistor 8 by taking a difference between the potential of the vertical signal line 16 when the gate of the amplification transistor 8 has been reset and the potential of the vertical signal line 16 when a signal component is being applied.

According to the image sensor of the structure as shown in FIG. 1, it is not so arranged that a signal charge obtained from the photodiode 2 is taken out directly. However, it is so arranged that the simultaneity of the signal charges obtained from the photodiode 2 is obtained by providing the capacity for holding signal charges from the photodiode 12, that is the sample hold capacitor 12a and 12b.

In the image sensor shown in FIG. 1, a light emitting diode (LED) not shown is used for deciding a light applied from the outside to an object of which image is to be picked up. In other words, a signal of only a background light such as a sun beam or an indoor light other than the light emitted by the LED and a signal of a light which is a combination of the background light and the light emitted by the LED are photoelectrically converted by the photodiode 2 and are then taken into the sample hold capacitors 12a and 12b. Then, a difference between the signal charges taken into these sample hold capacitors 12a and 12b is taken. However, when the LED is used, there arises a problem that the image sensor has a leakage of charges easily.

Although it is possible to cancel the leakage to some extent by taking a difference in the case of an external light, leaking charges depend on the distribution of the surrounding light and are not uniform on the plane. Therefore, there is a problem that there arises a difference between the quantity of leakage at a first time of storage after the LED has emitted a light and the quantity of leakage at a second time of storage after the LED has not emitted a light, for example, depending on the layout of the diffusion layer area of the transistors connected to the sample hold capacitors for holding the signal charges. Furthermore, the S/N ratio becomes poorer because of the variation in the leakage quantity.

Further, according to the above-described Japanese Patent Application No. 8-275949, since light emitting time and light emitting intervals are made shorter in order to restrict variation of the external lights, the light emitting volume becomes smaller if the number of LED cannot be increased for cost reason. To avoid this difficulty, it may be considered suitable to increase the LED light emitting time to a double. However, this often leads to a doubling of the dark current and the leaking quantity although the total light emitting volume of the LED is not doubled because of the characteristics of the LED. Accordingly, this does not contribute to improve the S/N ratio although the signal volume is increased.

On the other hand, when the number of LED is increased, the number of photon emitted is increased. However, if the number of LED is increased, it becomes impossible to reduce the size of the unit. Moreover, a larger power source is required because a large volume of current becomes necessary at one time. Therefore, a method which makes it possible to increase the sensitivity of the sensor without increasing the number of LED or without increasing the light emitting time has been required.

Further, according to the method described in the mode of implementation in the Japanese Patent Application No. 8-275949, the photodiode is saturated by the dark current the strong external light signal component at the time of adjusting the sensitivity. In order to use the unit within the range in which the photodiode is not saturated, the sensitivity adjusting operation must be repeated by many cycles. However, this has a problem of extremely limiting the number of signal storage operation because of the characteristics of the capacitors.

BRIEF SUMMARY OF THE INVENTION

In order to eliminate the above-described problems, it is an object of the present invention to provide a solid image pick-up unit which can restrict the variation in the leakage charge quantity at the light emitting time and non-light emitting time of the LED, which makes it possible to increase the signal charge quantity without increasing the number of LED and which can carry out sensitivity adjustment easily, and a method of driving this unit.

According to the present invention, there is provided a solid image pick-up unit having a unit cell laid out in a matrix two dimensional shape, by having a light receiving unit, an amplifying unit for amplifying a signal detected by the light receiving unit, a selecting unit for selecting a cell thereof and a resetting unit for resetting the light receiving unit, on a semiconductor substrate, wherein the unit cell has at least two storage units for storing a signal corresponding to a light quantity received by the light receiving unit, the semiconductor substrate is structured by a first conductive type and has a difference detecting unit for detecting a difference between signals stored in the at least two storage units, the light receiving unit is structured by a first diffusion layer area of a second conductive type opposite to the first conductive type, the at least two storage units are structured by a second diffusion layer area of a second conductive type, and a first diffusion layer area of the storage units is disposed at a position symmetrical with the center of the first diffusion layer area of the light receiving unit.

Further, according to the present invention, there is provided a solid image pick-up unit having a unit cell laid out in a matrix two dimensional shape, by having a light receiving unit, a detecting unit for detecting a signal charge by transferring a signal from the light receiving unit, an amplifying unit for amplifying a signal detected by the detecting unit, a selecting unit for selecting a cell thereof and a resetting unit for resetting the light receiving unit, on a semiconductor substrate, wherein the detecting unit is structured by first and second detecting units connected in series, the solid image pick-up unit includes a storage unit connected between the first detecting unit and the second detecting unit, and the resetting unit also resets the amplifying unit and the storage unit.

Further, according to the present invention, there is provided a solid image pick-up unit having a unit cell laid out in a matrix two dimensional shape, by having a photodiode, a transfer transistor for transferring a signal from the photodiode, a detection transistor for detecting a signal charge transferred by the transfer transistor, an amplification transistor for amplifying a signal detected by the detection transistor, a selection transistor for selecting a cell thereof, a reset transistor for resetting the photodiode and a sample hold capacitor for holding a signal corresponding to a light quantity received by the photodiode, on a semiconductor substrate, wherein the solid image pick-up unit includes a slice transistor to be connected to the photodiode through the transfer transistor and includes a slice capacitor having one end of an electrode thereof connected to the source and drain area of the slice transistor and having the other end of the electrode connected to a pulse circuit, and the other end of the source and drain area of the slice transistor is connected to the gate of the amplification transistor through the detection transistor, one end of the sample hold capacitor is connected to a connection section between the detection transistor and the amplification transistor, and the reset transistor is connected to a connection section between the transfer transistor and the gate of the slice transistor.

Further, according to the present invention, there is provided a solid image pick-up unit having a unit cell laid out in a matrix two dimensional shape, by having a photodiode, a transfer transistor for transferring a signal from the photodiode, a detection transistor for detecting a signal charge transferred by the transfer transistor, an amplification transistor for amplifying a signal detected by the detection transistor, a selection transistor for selecting a cell thereof, a reset transistor for resetting the photodiode and a first capacitor for holding a signal corresponding to a light quantity received by the photodiode, on a semiconductor substrate, wherein the solid image pick-up unit includes a second capacitor different from the first capacitor and connected to the gate of the amplification transistor, and the first capacitor has its one end connected to the photodiode through the transfer transistor and has the other end connected to the gate of the amplification transistor through the detection transistor, and the photodiode is connected to the reset transistor.

According to the present invention, there is provided a solid image pick-up unit having a unit cell laid out in a matrix two dimensional shape, by having a light receiving unit, an amplifying unit for amplifying a signal detected by the light receiving unit, a selecting unit for selecting a cell thereof, a resetting unit for resetting the light receiving unit and at least two storage units for storing a signal corresponding to a light quantity received by the light receiving unit, on a semiconductor substrate, wherein a selection of the storage units is carried out during an operation of the light receiving unit.

Further, according to the present invention, there is provided a method for driving a solid image pick-up unit having a unit cell laid out in a matrix two dimensional shape, by having a light receiving unit, a transfer unit for transferring a signal detected by the light receiving unit, an amplifying unit for amplifying a signal transferred by the transfer unit, a selecting unit for selecting a cell thereof, a resetting unit for resetting the light receiving unit and at least two storage units for storing a signal corresponding to a light quantity received by the light receiving unit, on a semiconductor substrate, wherein the method includes a first step of turning on the transfer unit and the resetting unit and injecting a charge into the light receiving unit and the storage units, a second step of discharging a charge injected into the storage units, a third step of transferring a signal detected by the light receiving unit to the storage units by keeping the transferring unit on, and a fourth step of reading out a charge stored in the storage units.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a cross-sectional structure diagram for showing the structure of the first mode of implementation of the solid image pick-up unit according to the present invention, and FIG. 3B is a potential diagram for explaining the first mode of implementation of the present invention.

FIG. 4 a timing chart for explaining one example of the method of driving a cell.

FIG. 6 is a diagram for showing one example of a timing chart for explaining the operation of the solid image pick-up unit of the structure shown in FIG. 5.

FIG. 7A is a cross-sectional structure diagram for showing the structure of the solid image pick-up unit shown in FIG. 5, FIG. 7B is a potential conceptional diagram for explaining the operation of the second mode of implementation of the present invention, FIG. 7C is a potential conceptional diagram for explaining the operation of the second mode of implementation of the present invention, and FIG. 7D is a potential conceptional diagram for explaining the operation of the second mode of implementation of the present invention.

FIG. 17 a timing chart for explaining one example of the method of driving an image sensor of the structure shown in FIG. 16.

FIG. 18 is a diagram for showing one example of a timing chart for explaining the operation of an eighth mode of implementation of the present invention.

DETAILED DESCRIPTION OF THE INVENTION

Modes of implementation of the present invention will be explained below with reference to the drawings.

Figure 2:
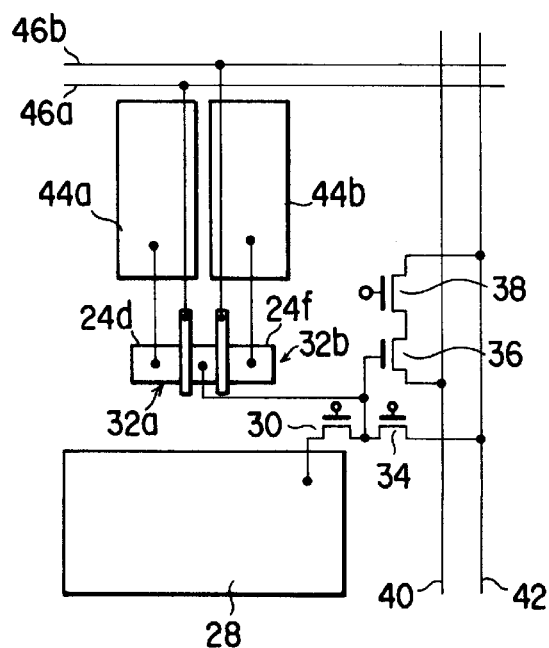
FIG. 2 is a diagram for showing the structure of a first mode of implementation of a solid image pick-up unit according to the present invention, and for schematically showing a unit cell.

FIG. 2 and FIG. 3A are diagrams for showing the structure of a first mode of implementation of the solid image pick-up unit according to the present invention, FIG. 2 being a structure diagram for schematically showing a unit cell and FIG. 3A being a diagram for showing a cross-sectional structure. Although not shown in the diagrams, it is assumed that the solid image pick-up unit has a unit cell laid out in a matrix two dimensional shape.

A p-well area 22 is formed on one of main planes of a p-type silicon substrate 20. A plurality of n+ layers 24a to 24j are formed in an island shape on the surface of the p-well area 22. An n-diffusion layer 26 of a photodiode 28 is formed in the vicinity of the n+ layer 24j at a portion where the p-well area 22 is not formed on the surface of the silicon substrate 20.

The photodiode 28 is connected to the source of a transfer transistor 30. The drain of the transfer transistor (Tr) 30 is connected to the drains of sample hold transistors 32a and 32b for transferring a charge to sample hold capacitors 32a and 32b to be described later, the drain of a reset transistor 34 and the gate of an amplification transistor 36. The drain of an address transistor 38 is connected to the drain of the amplification transistor 36.

A vertical signal line 40 is connected to the source of the amplification transistor 36, and a wiring 42 is connected to the source of the reset transistor 34 and the source of the address transistor 38. The connection layout of the amplification transistor 36 and the address transistor 38 may be opposite.

Sample hold capacitors 44a and 44b of equal plate area are connected to the sources of the sample hold transistors 32a and 32b. The sample hold capacitors 44a and 44b are disposed at positions symmetrical with the center of the n-diffusion layer 26 which is a diffusion layer area of the photodiode 28. Ideally, the n+ layers 24d and 24f which are diffusion layer areas of the sample hold transistors 32a and 32b are also disposed at positions symmetrical with the center of the n-diffusion layer 26 of the photodiode 28. Further, the sample hold capacitors 44a and 44b are connected to signal lines 46 (46a and 46b).

It is assumed that the capacity values of the sample hold capacitors 44a and 44b are smaller than the capacity value of the photodiode 28.

Next, the operation of the solid image pick-up unit having the above-described structure will be explained below with reference to FIG. 3A and FIG. 4.

FIG. 3B is a potential diagram for explaining a first mode of implementation of the present invention, and FIG. 4 is a timing chart for explaining one example of the method of driving a cell.

At first, after the transfer transistor 30, the reset transistor 34 and the sample hold transistor 32a are turned on and the potential of the wiring 42 is set low, a charge is injected into the photodiode 28 and the sample hold capacitor 44a. Then, after the potential of the wiring 42 is returned to an original high level, the charge stored in the sample hold capacitor 44a is discharged.

On the other hand, the photodiode 28 becomes equal to the gate potential of the transfer transistor 30, and the sample hold capacitor 44a becomes equal to the reset potential. Then, after a photoelectric conversion, the signal is transferred to the sample hold capacitor 44a.

Next, after the transfer transistor 30, the reset transistor 34 and the sample hold transistor 32b are turned on and the potential of the wiring 42 is set low, a charge is injected into the photodiode 28 and the sample hold capacitor 44b. Then, after the potential of the wiring 42 is returned to an original high level, the charge stored in the sample hold capacitor 44b is discharged.

On the other hand, the photodiode 28 becomes equal to the gate potential of the transfer transistor 30, and the sample hold capacitor 44b becomes equal to the reset potential. Then, after a photoelectric conversion, the signal is transferred to the sample hold capacitor 44b.

After the signal charges have been transferred to the sample hold capacitors 44a and 44b in the manner as described above, the charges stored in the sample hold capacitors 44a and 44b are read out and a source follower circuit carries out the operation of outputting a signal to a vertical signal line 40 twice, so that a known differential circuit not shown takes the difference.

Although the above operation is first carried out at the sample hold capacitor 44a side in the above explanation, it is needless to mention that the operation is carried out first at the sample hold capacitor 44b side.

In this case, the potential as shown in FIG. 3B can be set when the threshold values of transistors are set as follows:

$$V_{th} (\text{TRAN}) > V_{th} (\text{RESET}) > V_{th} (\text{SAMP}) \qquad (1)$$

where, $V_{th}$ (RESET) denotes the threshold value of the reset transistor 34, $V_{th}$ (TRAN) denotes the threshold value of the transfer transistor 30 and $V_{th}$ (SAMP) denotes the threshold value of the sample hold transistor 32a (32b). Further, it becomes possible to transfer almost all of the potential of the photodiode 28 to the sample hold capacitors 44a and 44b and to transfer almost all of the signal charges stored in the sample hold capacitors 44a and 44b to the gate of the amplification transistor 36.

In this case, when the above expression (1) is satisfied, it becomes possible to set the potential as shown in FIG. 3B even if the gate voltage output from a shift register not shown is the same, so that a single power source can be obtained.

According to the prior-art solid image pick-up unit, the transfer of a charge is finished when the potentials of the source and the drain become equal after a transistor is turned on. When the capacitors at the source area side and at the drain area side are denoted $C_S$ and $C_D$ respectively, a signal change of $V=Q/(C_S+C_D)$ occurs and all the signals can be transferred. However, according to the first mode of implementation of the present invention, all the signals can be transferred when the signal change of $V=Q/C_D$ occurs.

In general, when an incident light beam to a certain pixel of a unit cell is strong, a signal charge leaked out from this pixel enters each sample hold capacitor through the diffusion layer area. According to the conventional solid image pick-up unit having two sample hold capacitors, when a pixel has received a strong incident light beam, a charge leaks by a larger quantity in a diffusion layer located at a position near the pixel having received a strong incident light beam than a charge leaked in a diffusion layer located at a position far from this pixel, of the charge transfer transistors to the two sample hold capacitors. Accordingly, a difference of light signals, even if taken two times, is different from the true value.

Further, there is also a leakage of a signal charge when a photoelectric conversion is carried out at a position deep in the substrate like the case where the wavelength of an incident light beam is long.

However, when the two sample hold transistors are disposed at positions symmetrical with the photodiode like the case of the present mode of implementation, the quantities of the charges leaked to the two sample hold capacitors become equal. Therefore, when a difference of the two sample hold capacitors is taken, only a true signal component remains and thus, it becomes possible to restrict the variation of the leakage quantity.

This applies not only to FIG. 2 but also to the modes of implementation shown in FIGS. 5, 9 and 10 to be described later.

A second mode of implementation of the present invention will be explained below with reference to FIGS. 5 to 8D. In the present mode of implementation to be described below, the same reference numbers are attached to parts which are the same as those of the first mode of implementation of the present invention, and their explanation will be omitted.

Figure 5:
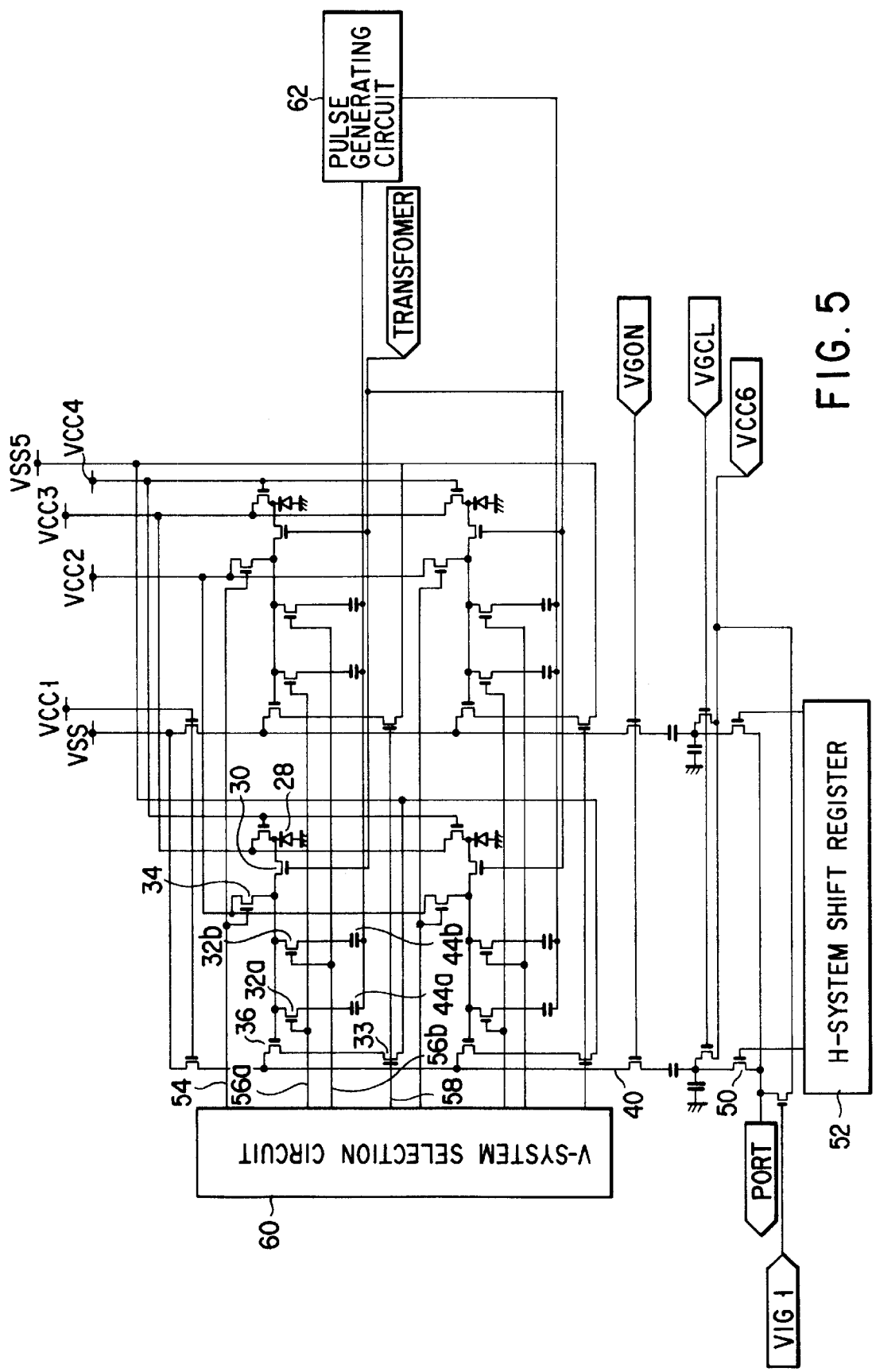
FIG. 5 is a circuit structure diagram for showing a second mode of implementation of the solid image pick-up unit according to the present invention.

FIG. 5 is a circuit structure diagram for showing a second mode of implementation of the solid image pick-up unit according to the present invention.

In FIG. 5, the solid image pick-up unit has the photodiode 28 connected to the reset transistor 34 and the amplification transistor 36 through the transfer transistor 30. A circuit structured by the sample hold transistor 32a and the sample hold capacitor 44a and a circuit structured by the sample hold transistor 32b and the sample hold capacitor 44b are connected in parallel respectively between the transfer transistor 30 and the amplification transistor 36.

The amplification transistor 36 has its drain connected to a horizontal shift register (H-system shift register) 52 through the vertical signal line 40 and a horizontal selection transistor 50 while keeping a connection with the gate of the address transistor 38. Further, the reset transistor 34 is connected to a vertical shift register (V-system selection circuit) 60 through a reset line 54, the sample hold transistors 32a and 32b are connected to the vertical shift register 60 through sample hold transistor control lines 56a and 56b for controlling the sample hold transistors 32a and 32b respectively, and the address transistor 38 is connected to the vertical shift register 60 through a horizontal address line 58.

Figure 1:
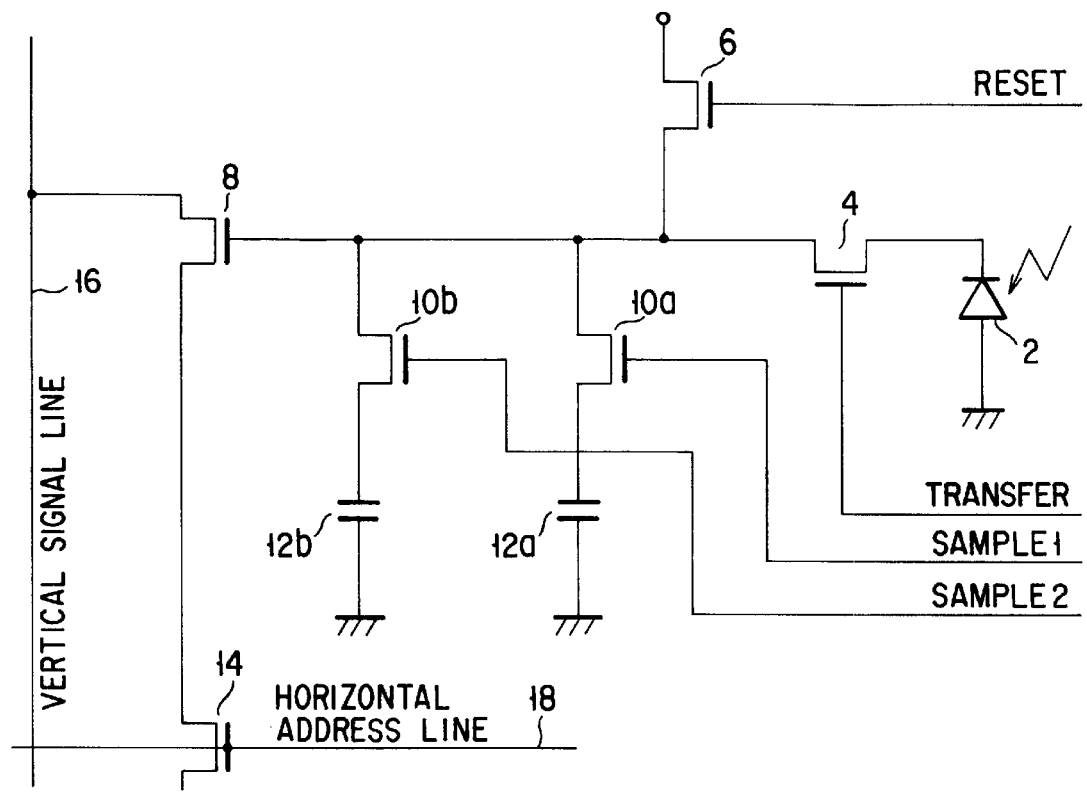
FIG. 1 is a circuit diagram for showing an example of the structure of a conventional MOS-type image sensor.

The basic circuit structure of the solid image pick-up unit of the second mode of implementation of the present invention is the same as that of the prior-art solid image pick-up unit shown in FIG. 1, and the cross-sectional structure is the same as the structure of the first mode of implementation of the present invention shown in FIG. 3, except that the two sample hold capacitors 44a and 44b are connected to a pulse generating circuit 62 without being grounded.

The operation of the second mode of implementation of the present invention will be explained next.

The basic operation of the present solid image pick-up unit is the same as that of the prior-art solid image pick-up unit shown in FIG. 1. FIG. 6 is an example of the timing chart for explaining the operation of the solid image pick-up unit of the structure shown in FIG. 5, FIG. 7A is a cross-sectional structure diagram for showing the structure of the solid image pick-up unit of the structure shown in FIG. 5, and FIGS. 7B through 7D are potential conceptional diagrams.

At first, the reset transistor 34 and the sample hold transistor 32a are turned on in the state that the wiring 42 is kept at a high potential, and a potential is reset to become the one as shown in FIG. 7B. Next, after the reset transistor 34 is turned off, the transfer transistor 30 is turned on and a signal is transferred to the sample hold capacitor 44a.

Next, the potential of the wiring 42 is returned to a lower potential than that shown in FIG. 7B. Thereafter, the amplification transistor 36 is reset to a state as shown in FIGS. 7C and 7D, and then a lower potential than that applied at the time of resetting is applied to the gate of the sample hold transistor 32a and a signal charge is transferred to the gate of the amplification transistor 36.

Figures 8A, 8B:
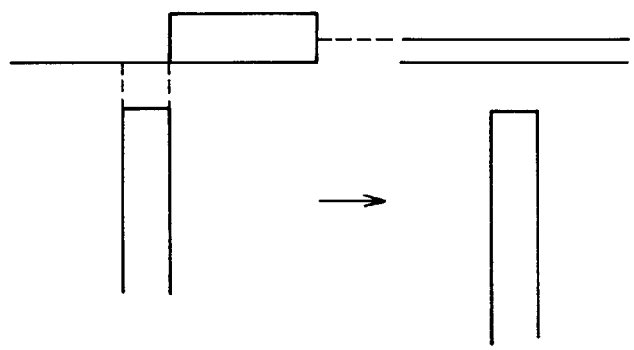
FIG. 8A is a potential conceptional diagram for explaining the operation of the solid image pick-up unit.
FIG. 8B is a potential conceptional diagram for explaining the operation of the solid image pick-up unit.

In this case, according to the prior-art solid image pick-up unit, a signal charge is transferred from the sample hold capacitor to the amplification transistor as shown in the potential diagrams of FIGS. 8A and 8B. On the other hand, according to the second mode of implementation of the present invention, a signal charge is transferred as shown in the potential diagrams of FIGS. 8C and 8D.

Figures 8C, 8D:
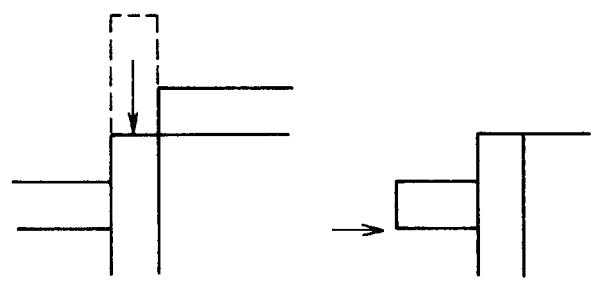
FIG. 8C is a potential conceptional diagram for explaining the operation of the solid image pick-up unit.
FIG. 8D is a potential conceptional diagram for explaining the operation of the solid image pick-up unit.

In the state as shown in FIGS. 8A and 8B, the voltage change of the amplification transistor becomes $Q_{PD}/(C_{samp}+C_0)$. Whereas, according to the method of the second mode of implementation of the present invention as shown in FIGS. 8C and 8D, the voltage change of the gate of the amplification transistor becomes $Q_{PD}/C_0$, with a resultant improved sensitivity and improved S/N ratio.

Figure 9:
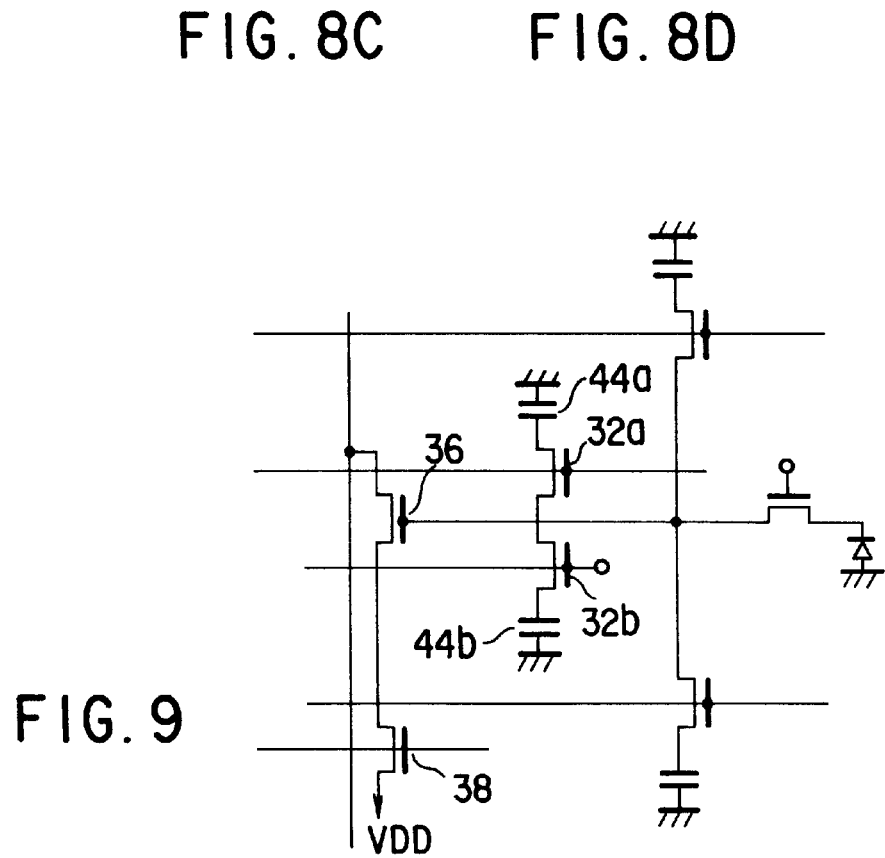
FIG. 9 is a circuit diagram for showing the structure of a third mode of implementation of the solid image pick-up unit according to the present invention.

FIG. 9 is a circuit diagram for showing the structure of a third mode of implementation of the present invention.

According to the third mode of implementation of the present invention, the sample hold capacitor in the first mode of implementation of the present invention is divided into a plurality of pieces and each of the divided capacitors has a sample hold circuit. Since the operation is based on that of the first mode of implementation of the present invention, the explanation of the operation will be omitted.

Although the sample hold capacitor is divided into two in FIG. 9, the same principle also applies to the case where the sample hold capacitor is divided into three or more. In this case, the change of the potential of the amplification transistor 36 becomes $Q_{PD}/(N \times C_{samp}+C_0)$, where N denotes the number of division.

With the above-described structure, it becomes possible to adjust the sensitivity.

Figure 10:
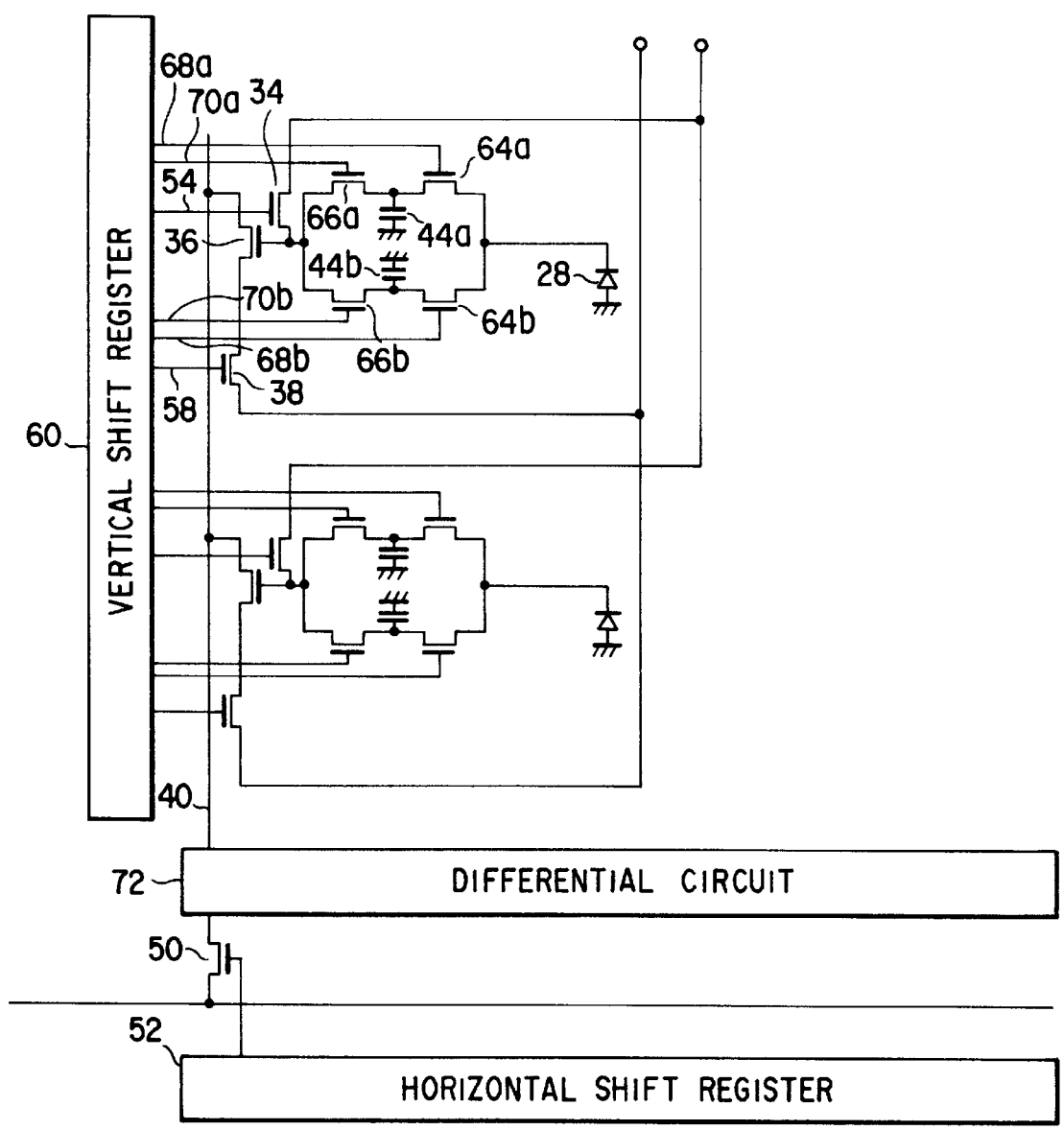
FIG. 10 is a circuit diagram for showing the structure of a fourth mode of implementation of the solid image pick-up unit according to the present invention.

FIG. 10 is a circuit diagram for showing the structure of a fourth mode of implementation of the present invention.

In FIG. 10, sample hold capacitor 44a is connected to the sources of transfer transistors 64a and 66a, and similarly, the sample hold capacitor 44b is connected to the sources of transfer transistors 64b and 66b. Then the photodiode 28 is connected to the drains of the transfer transistors 64a and 64b. On the other hand, the drain of the reset transistor 34 and the gate of the amplification transistor 36 are connected to the drains of the transfer transistors 66a and 66b.

The transfer transistors 64a and 64b and 66a and 66b are connected to the vertical shift register 60 through transfer transistor control lines 68a and 68b and 70a and 70b respectively. The vertical signal line 40 connected to the source of the amplification transistor 36 is connected to the horizontal shift register 52 through a differential circuit 72 and the horizontal selection transistor 50.

Figures 11A, 11B:
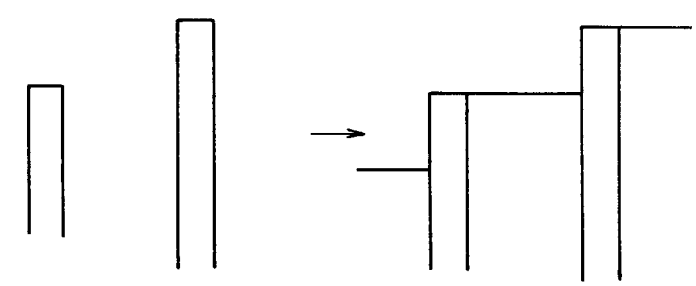
FIG. 11A is a potential conceptional diagram for explaining the operation of the solid image pick-up unit of the structure shown in FIG. 10.
FIG. 11B is a potential conceptional diagram for explaining the operation of the solid image pick-up unit of the structure shown in FIG. 10.

In the solid image pick-up unit having the above-described structure, a potential as shown in FIG. 11 is obtained when the threshold value of the reset transistor 34 is set smaller than the threshold values of the transfer transistors 66a and 66b and further when the threshold values of the transfer transistors 64a and 64b are set smaller than the threshold values of the transfer transistors 66a and 66b.

With the above-described arrangement, all the signal charges transferred to the sample hold capacitors are transferred to the amplification transistor 36. Therefore, the voltage change becomes $Q_{PD}/C_0$ with an improved sensitivity, similar to the case of the potential shown in FIGS. 8C and 8D.

Further, when the circuit structure shown in FIG. 11 and the above-described relationship of the threshold values of the transistors are kept, only a low level (L) pulse and a high level (H) pulse are required and a single power source can be applied, requiring only a simple structure of a selection circuit.

Next, a fifth mode of implementation of the present invention will be explained below.

Figure 12:
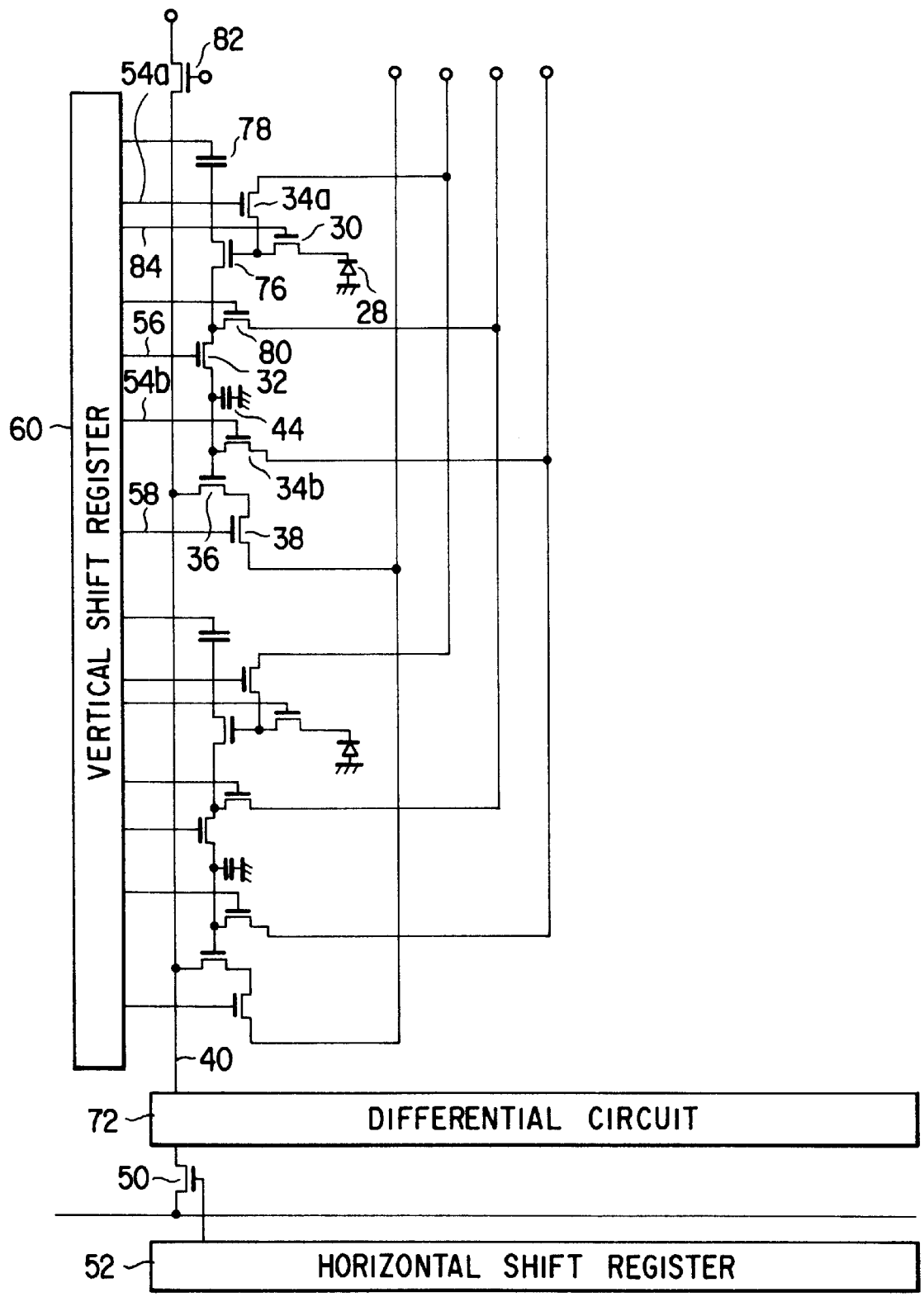
FIG. 12 is a circuit diagram for showing the structure of a fifth mode of implementation of the solid image pick-up unit according to the present invention.
Figure 13:
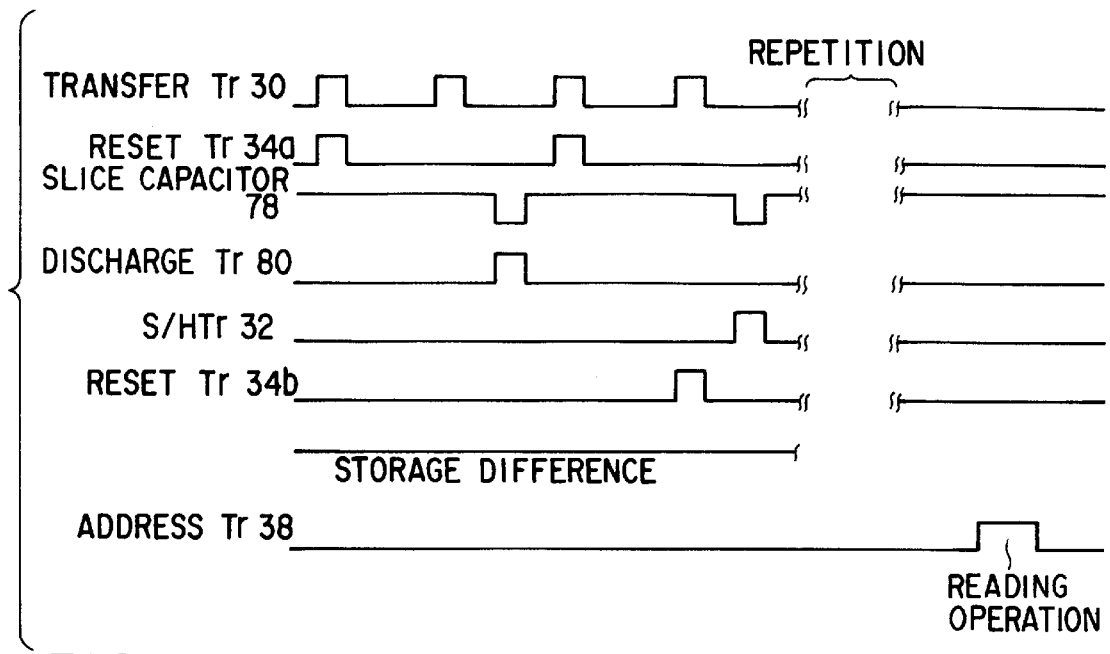
FIG. 13 is a diagram for showing one example of a timing chart for explaining the operation of the circuit shown in FIG. 12.

FIG. 12 is a circuit diagram for showing the structure of a fifth mode of implementation of the present invention and FIG. 13 is one example of a timing chart for explaining the operation of the circuit shown in FIG. 12.

In FIG. 12, the solid image pick-up unit has its photodiode 28 connected to a reset transistor 34a and a slice transistor 76 through the transfer transistor 30. The slice transistor 76 has its source connected to the vertical shift register 60 through a slice capacitor 78 and has its drain connected to the drains of the sample hold transistor 32 and a discharge transistor 80.

The source of the sample hold transistor 32 is connected to the source of a reset transistor 34b and the gate of the amplification transistor 36 through the sample hold capacitor 44. The amplification transistor 36 has its drain connected to the gate of the address transistor 38 and also connected to the horizontal shift register 52 through the vertical signal line 40 of which other end is connected to a load transistor 82, the differential circuit 72 and the horizontal selection transistor 50.

The transfer transistor 30 is connected to the vertical shift register 60 through a transfer transistor control line 84, the discharge transistor 80 is connected to the vertical shift register 60 through a discharge transistor control line 86, the reset transistors 34a and 34b are connected to the vertical shift register 60 through reset lines 54a and 54b, the sample hold transistor 32 is connected to the vertical shift transistor 60 through a sample hold transistor control line 56, and the address transistor 38 is connected to the vertical shift transistor 60 through the horizontal address line 58.

The above-described structure is one example of the solid image pick-up unit for repeating the signal storage differential operation by a plurality of times. Based on the above structure, it becomes possible to take out only the true signal charge in the sample hold capacitor 44.

Accordingly, it is possible to store the differential signal until when the potential of the sample hold capacitor 44 exceeds the gate potential of the transfer transistor 30 even if a strong external light beam exists. Therefore, when the sensitivity is low, it is possible to increase the true signal charge quantity by increasing the number of signal storage. Since the quantity of light emitted at one time can be restricted in addition to the fact that sensitivity adjustment can be facilitated by the above-described arrangement, it becomes not necessary to increase the number of LED or install a large-capacity power source.

Further, by making the capacity of the slice capacitor 78 larger than the capacity of the sample hold capacitor 44 of the transfer destination, it becomes possible to increase the sensitivity without increasing the light emitting quantity of the LED. Accordingly, a smaller power source can be used and the number of LED can also be decreased.

Figure 15:
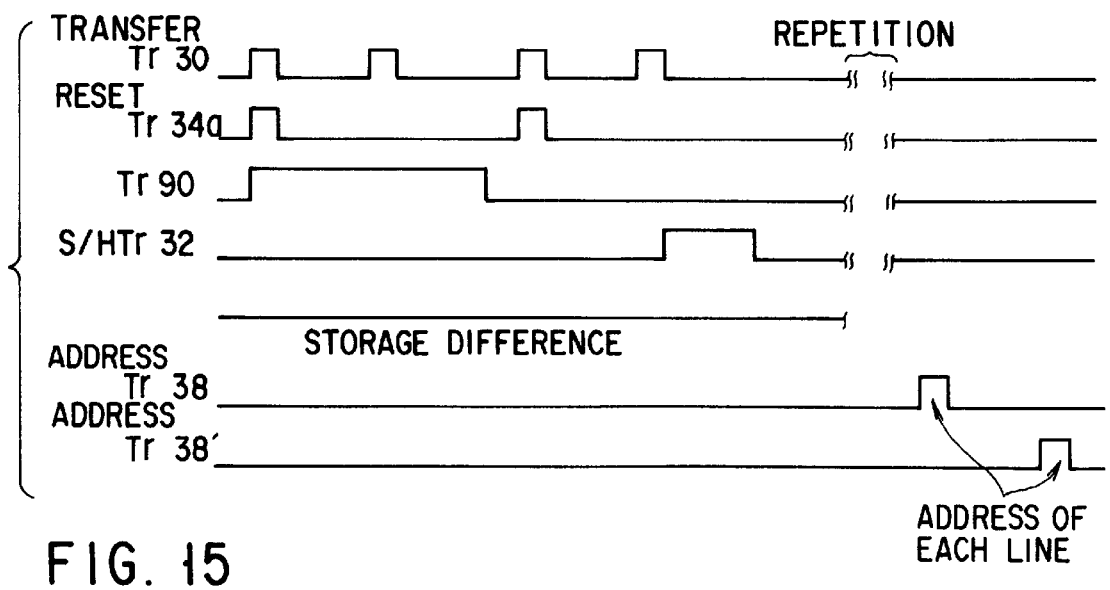
FIG. 15 is a diagram for showing one example of a timing chart for explaining the operation of the circuit shown in FIG. 14, and for showing an example of carrying out a storage differential operation by a plurality of times.
Figure 14:
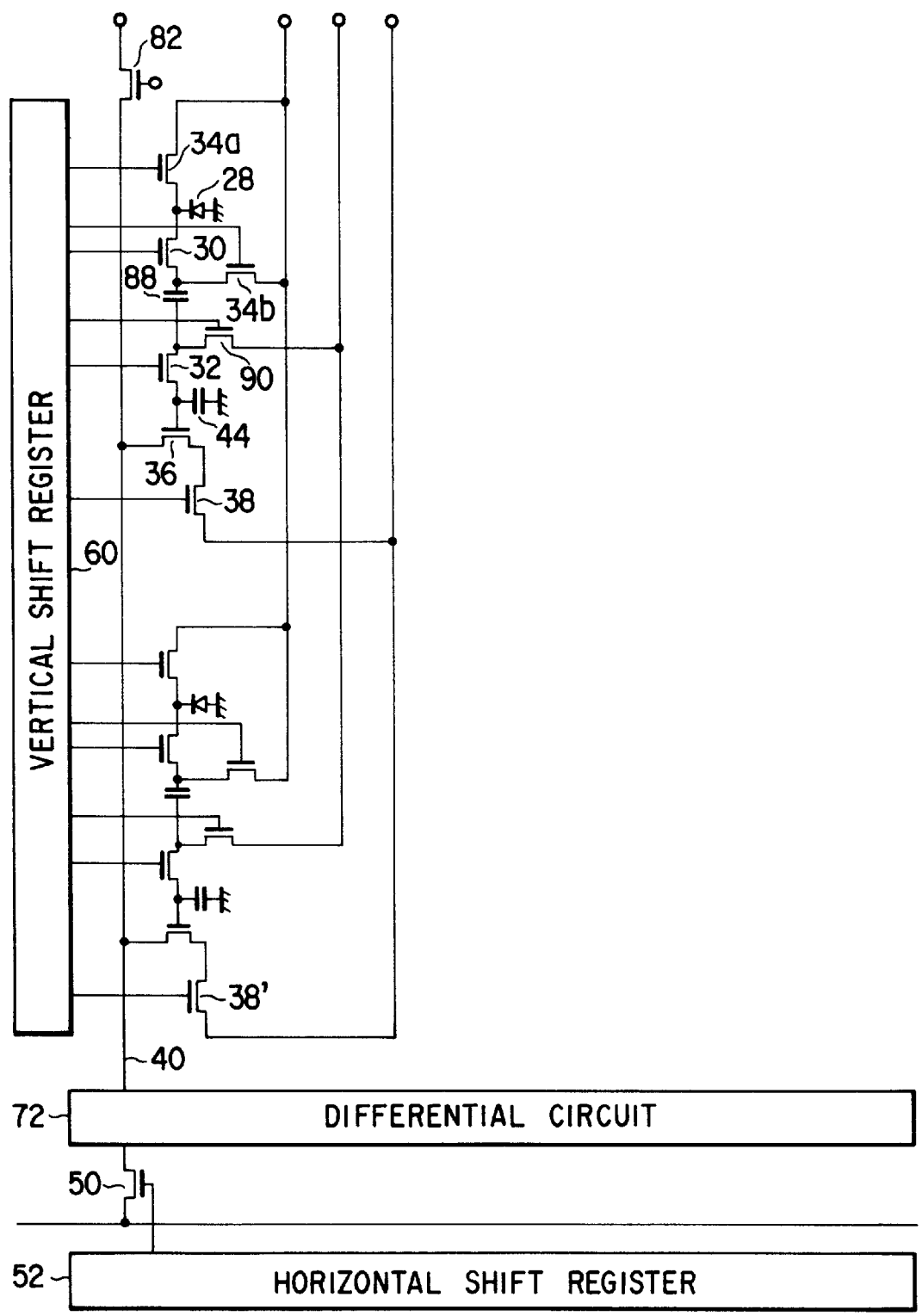
FIG. 14 is a circuit diagram for showing the structure of a sixth mode of implementation of the solid image pick-up unit according to the present invention.

FIG. 14 is a circuit diagram for showing the structure of a sixth mode of implementation of the present invention, and FIG. 15 is one example of the timing chart for explaining the operation of the circuit in FIG. 14, that is, for explaining an example of repeating the storage differential operation by a plurality of times.

In FIG. 14, the photodiode 28 is connected between the reset transistor 34a and the transfer transistor 30. Between the transfer transistor 30 and the amplification transistor 36, there are connected a clamp capacitor 88, the sample hold transistor 32 and the sample hold capacitor 44. A transistor 90 is connected to a connection point between the clamp capacitor 88 and the sample hold transistor 32.

Since this circuit can take out only the true signal charge component to the sample hold capacitor 44, it is possible to store the differential signal until when the potential of the sample hold capacitor 44 exceeds the gate potential of the transistor 32 even if a strong external light beam exists.

Therefore, the quantity of light emitted at one time can be restricted in addition to the fact that sensitivity adjustment can be facilitated in a manner similar to that of the circuit of the fifth mode of implementation shown in FIG. 12. Accordingly, it becomes not necessary to increase the number of LED or install a large-capacity power source.

Figure 16:
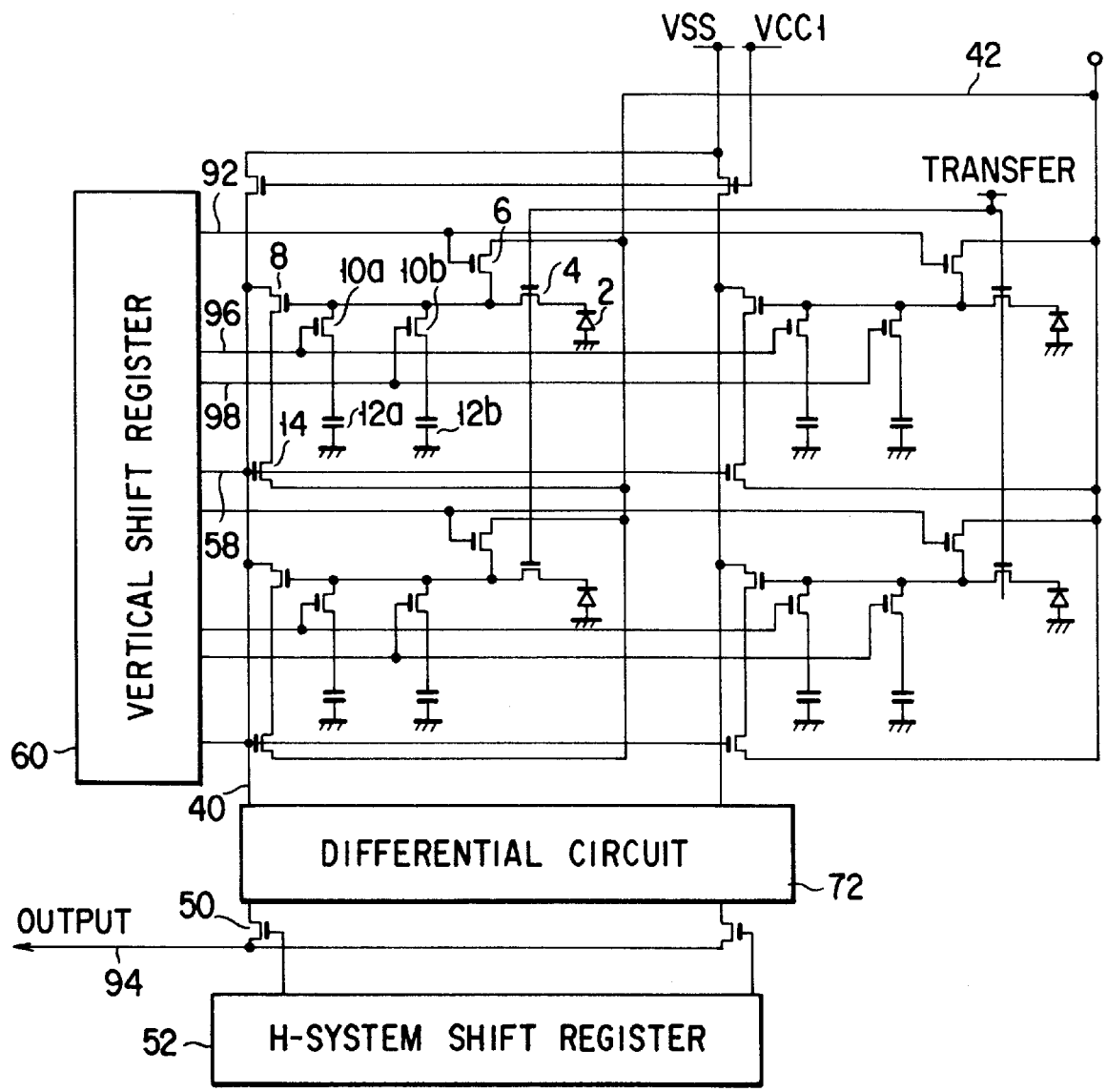
FIG. 16 is a circuit diagram for showing the structure of a seventh mode of implementation of the solid image pick-up unit according to the present invention.

FIG. 16 is a circuit diagram for showing the structure of a seventh mode of implementation of the present invention.

In FIG. 16, the image sensor has its photodiode 2 connected to a reset transistor 6 which is connected to a reset line 92 and an amplification transistor 8 which is connected to the vertical signal line 40, through the transfer transistor 4. Between the transfer transistor 4 and the amplification transistor 8, there are connected in parallel respectively a circuit structured by a sample hold transistor 10a and a sample hold capacitor 12a and a circuit structured by a sample hold transistor 10b and a sample hold capacitor 12b.

The amplification transistor 8 has its drain connected to the gate of the address transistor 14 and also connected to the horizontal selection transistor 50 which is connected to a horizontal signal line 94 through the vertical signal line 40 and a differential circuit 72. Further, 96 and 98 denote transfer transistor control lines for controlling the sample hold transistors 10a and 10b.

Next, one example of the method for driving the image sensor will be explained with reference to the timing chart shown in FIG. 17.

At first, after the transfer transistor 4, the reset transistor 6 and the sample hold transistors 10a and 10b are turned on and the potential of the wiring 42 is set low, a charge is injected into the photodiode 2 and the sample hold capacitors 12a and 12b respectively. Then, after the potential of the wiring 42 is returned to its original high potential, the charges injected into the sample hold capacitors 12a and 12b are discharged.

The photodiode 2 becomes equal to the gate potential of the transfer transistor 4, and the sample hold capacitors 12a and 12b become equal to the reset potential. Thereafter, after a photoelectric conversion, the signal is transferred to the sample hold capacitors 12a and 12b.

When a signal charge has been transferred to the two sample hold capacitors 12a and 12b in the manner as described above, the charges stored in the sample hold capacitors 12a and 12b are read out, the source follower circuit carries out the operation of outputting the read charges to the vertical signal line 40 two times and the differential circuit 72 takes out the difference.

For example, a light of the LED or other light reflected from a hand, an object of which image is to be picked up, is used as a first light signal. Then, a background light or other light reflected from the object is used as a second light signal. By taking the difference between the first light and the second light, it becomes possible to extract the object of which image is to be picked up, such as the hand, from the screen including the background.

As explained above, according to the seventh mode of implementation of the present invention, it becomes possible to cancel the variation in the threshold value by taking a difference between the potential of the vertical signal line 40 at the time when the gate of the amplification transistor 8 has been reset and the potential of the vertical signal line 40 at the time when a signal component is being applied.

In the image sensor of the structure shown in FIG. 16, it is not so arranged that a signal charge obtained from the photodiode 2 is taken out directly. However, it is so arranged that the simultaneity of the signal charges obtained from the photodiode 2 is obtained by providing the capacity for holding signal charges from the photodiode 2, that is the sample hold capacitor 12a and 12b.

As explained above, according to the seventh mode of implementation of the present invention, after the photodiode has been reset, the transfer transistor is turned off and the signal is stored. After the storage has been finished, the transfer transistor and the sample hold transistors are turned on and the signal charge is transferred to the sample hold capacitor.

An eighth mode of implementation of the present invention will be explained next.

FIG. 18 is one example of the timing chart for explaining the operation of the eighth mode of implementation of the present invention. The structure of the image sensor is similar to that of the seventh mode of implementation, and the circuit shown in FIG. 16 is used.

According to the above-described seventh mode of implementation, the transfer transistor 4 and the sample hold transistors 10a and 10b are kept turned off while a signal is being stored. On the other hand, according to the eighth mode of implementation of the present invention, the transfer transistor 4 and the sample hold transistors 10a and 10b are kept turned on while the signal is being stored. Accordingly, since the storage capacity is increased by the capacity of the sample hold capacitors 12a and 12b, the saturation proof of the photodiode 2 is strengthened to become strong against blooming.

Further, since a maximum signal potential becomes the same as the signal potential within the photodiode 2, a maximum saturation output becomes larger so that the dynamic range becomes wider than that of the seventh mode of implementation of the present invention.

Furthermore, the saturation by a light other than the reflection beam of the light from the LED can be prevented when the signal quantity of the light other than the reflection beam of the light from the LED is decreased by shortening the storage time. On the other hand, when the light other than the reflection beam of the light from the LED is weak, it is desirable to increase the storage time in order to increase the signal quantity for improving the S/N ratio.

As explained above, it becomes possible to achieve a changing of the signal storage time according to the surrounding environment, by generating a timing of the signal storage period by an externally provided timing circuit and by generating a timing for reading by an internally provided timing circuit, and by combining both timings. In this case, the timing of the signal storage period can be made common to all the pixels, so that only a few timing pulses are required to be input from the outside. Therefore, this does not become a burden.

Figure 19:
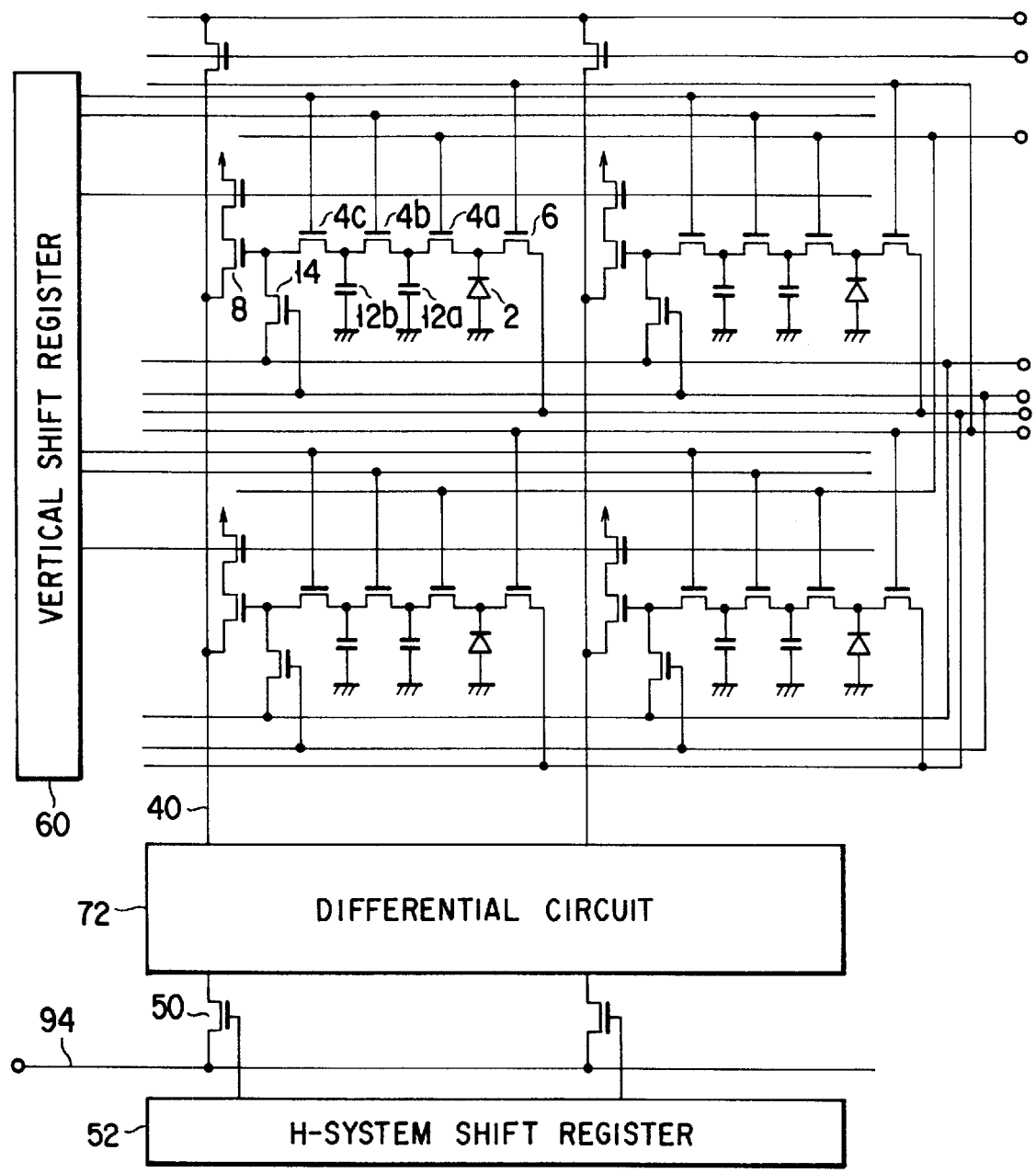
FIG. 19 is a circuit diagram for showing the structure of a ninth mode of implementation of the solid image pick-up unit according to the present invention.

FIG. 19 is a circuit diagram for showing the structure of a ninth mode of implementation of the solid image pick-up unit according to the present invention.

In FIG. 19, this image sensor has the photodiode 2 connected to the sample hold capacitor 12a through a transfer transistor 4a and connected to the sample hold capacitor 12b through a transfer transistor 4b. The amplification transistor 8 and the address transistor 14 are connected to the sample hold capacitor 12b through a transfer transistor 4c. The reset transistor 6 is connected to the photodiode 2.

The circuit structure other than that of the above-described cell section is similar to the structure of the circuit shown in FIG. 16, and therefore their explanation will be omitted.

In the above-described structure, it is assumed that a light from the LED or other light reflected by an image pick-up object such as a hand has been taken into the photodiode 2 as a first-time light signal, for example. The taken-in light is photoelectrically converted by the photodiode 2, and a charge is injected into the sample hold capacitor 12a at first when the transfer transistor 4a is turned on. Next, the transfer transistor 4a is turned off and the transfer transistor 4b is turned on, so that a signal charge including the LED light is transferred from the sample hold capacitor 12a to the sample hold capacitor 12b.

Thereafter, a background light or other light reflected from the image pick-up object is taken into the photodiode 2 as a second-time light signal and is then photoelectrically converted. In this case, the photoelectrically converted signal charge is injected into the sample hold capacitor 12a through the transfer transistor 4a which has been turned on again.

On the other hand, when the transfer transistor 4c has been turned on, the signal charge injected into the sample hold capacitor 12b is discharged to the vertical signal line 40 through the amplification transistor 8 and is then supplied to the differential circuit 72. Similarly, the charge of the second-time light signal is injected into the sample hold capacitor 12b and is then supplied to the differential circuit 72. The differential circuit 72 takes the difference between the first-time light and the second-time light, so that it becomes possible to extract easily the image pick-up object such as a hand from the screen including the background.

According to the ninth mode of implementation of the present invention, since the two kinds of signal including the signal containing a reflection light of the LED light and the signal of only an external light are taken into the differential circuit through the same sample hold capacitor without exception, there is no influence of a variation in the manufacturing of the sample hold capacitors. Accordingly, there is less influence of noise.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid image pick-up unit having a unit cell laid out in a matrix two dimensional shape, by having light receiving means, amplifying means for amplifying a signal detected by said light receiving means, selecting means for selecting a cell thereof and resetting means for resetting said light receiving means, on a semiconductor substrate, wherein said unit cell has at least two storage means for storing a signal corresponding to a light quantity received by said light receiving means;

said semiconductor substrate is structured by a first conductive type and has difference detecting means for detecting a difference between signals stored in aid at least two storage means;

said light receiving means is structured by a first diffusion layer area of a second conductive type opposite to said first conductive type;

said at least two storage means are structured by a second diffusion layer area of the second conductive type; and a first diffusion layer area of said storage means is disposed at a position symmetrical with the center of said first diffusion layer area of said light receiving means.

2. A solid image pick-up unit according to claim 1, wherein said light receiving means is structured by a photodiode, said amplifying means is structured by an amplification transistor, said resetting means is structured by a reset transistor, and said at least two storage means are structured by capacitors; and said photodiode is connected to the gate of said amplification transistor, said at least two capacitors have their respective one electrode connected to said amplification transistor and have their respective other electrode grounded.

3. A solid image pick-up unit according to claim 1, wherein said light receiving means is structured by a photodiode, said amplifying means is structured by an amplification transistor, said resetting means is structured by a reset transistor, and said at least two storage means are structured by capacitors; and said photodiode is connected to the gate of said amplification transistor, said at least two capacitors have their respective one electrode connected to said amplification transistor and have their respective other electrode connected to pulse input means.

4. A solid image pick-up unit according to claim 2 or 3, wherein said at least two capacitors have capacities smaller than the capacity of said photodiode.

* * * * *